United States Patent [19]

Ishiwata et al.

[11] Patent Number: 5,439,616
[45] Date of Patent: Aug. 8, 1995

[54] INFRARED LIGHT-EXCITED LIGHT-EMITTING SUBSTANCE

[75] Inventors: Shoji Ishiwata; Etsuji Kimura; Michihiro Tanaka; Yasuhiro Hanaue; Yuhu Wang; Shinobu Nagahama; Naruhito Sawanobori, all of Saitama, Japan

[73] Assignee: Mitsubishi Materials Corporation, Japan

[21] Appl. No.: 285,050

[22] Filed: Aug. 3, 1994

[30] Foreign Application Priority Data

Aug. 6, 1993 [JP] Japan ................... 5-214935

[51] Int. Cl.$^6$ .......................... G02B 5/20; C09K 11/08
[52] U.S. Cl. .......................... 252/584; 252/301.4 H; 252/587; 423/463; 423/472
[58] Field of Search ............. 252/301.4 H, 584, 587; 423/463, 472

[56] References Cited

U.S. PATENT DOCUMENTS

| | | | |
|---|---|---|---|
| 4,180,478 | 12/1979 | Omi et al. | 252/301.4 H |
| 4,512,911 | 4/1985 | Kotera et al. | 252/301.4 H |
| 4,515,706 | 5/1985 | Takahara et al. | 252/301.4 H |
| 5,098,813 | 3/1992 | Nakano et al. | 252/301.4 H |
| 5,198,679 | 3/1993 | Katoh et al. | 252/301.4 H |

Primary Examiner—Philip Tucker
Attorney, Agent, or Firm—Webb Ziesenheim Bruening Logsdon Orkin & Hanson

[57] ABSTRACT

An infrared light-excited light-emitting substance given by the general formula:

$R1_xR2_{(1-x)}Ba_zCl_{3+2z}$ where R1 is a rare-earth element, x satisfies the relation $0.01 < x \leq 1$, R2 is another rare-earth element, and z satisfies the relation $1 < z < 4$. Preferably, the substance is a transparent crystal having a transparency exceeding 70% in a wavelength range from 400 to 1500 nm, excluding wavelengths absorbed by rare-earth ions. The light-emitting substance can convert infrared light into visible light in a wavelength range from blue light to green light at a high conversion efficiency.

13 Claims, 8 Drawing Sheets

INFRARED LIGHT-EXCITED LIGHT-EMITTING SUBSTANCE

FIELD OF THE INVENTION

The present invention relates to a substance which emits visible light when excited with infrared radiation and, more particularly, to an infrared light-excited light-emitting substance containing a transparent crystal adapted for use as a laser element for converting infrared laser light into visible laser light.

BACKGROUND OF THE INVENTION

Today, laser diodes have been put into practical use as light sources for optical communications. Laser diodes used in optical communications are designed to lase wavelengths of 1.33 $\mu$m and 1.55 $\mu$m which are lost only a little in quartz fibers. Also, laser diode lasing wavelengths of approximately 780 nm have been extensively used in digital audio applications, laser printers, and other applications. On the other hand, infrared light having wavelengths longer than 780 nm is not visible and so laser elements emitting shorter wavelengths have been developed to make the laser light usable in the visible range. For example, compact visible laser light sources are required for high-density optical memories and displays. However, the wavelengths of laser diodes which have been put into practical use today are approximately 650 nm, i.e., red light. Laser diodes emitting shorter wavelengths of laser light, e.g., green light and blue light, have not been put into practical use. In this connection, attempts have been made to obtain shorter wavelengths of laser light by doubling the frequency by the use of second-harmonic generation. If this method is utilized, infrared laser light, for example, having a wavelength of 850 nm can be converted into blue light having a wavelength of 425 nm. Unfortunately, the difficulties of temperature control and cost prevent production of a compact SHG laser.

Accordingly, an up-conversion laser for converting infrared diode laser light into blue or green laser light, by making use of an up-conversion phenomenon, is expected to be developed. It is reported that as a light-emitting device of this kind, up-conversion lasers have been successfully oscillated, using a single crystal of a fluoride such as YLiF$_4$:Er or heavy metal fluoride glass as typified by ZBLAN glass (Wilfried Lenth et al., Optics & Photonics News, 3, [3], 8–15 (1992)). However, the oscillation intensity is insufficient and far from practicability. To have laser oscillation of sufficient intensity, a material having a better light conversion efficiency is required. To satisfy this requirement, various glass materials have been developed, as disclosed in Japanese Patent Laid-Open Nos. 295828/1991, 12035/1992, and 328191/1992.

However, with these glass materials, it is difficult to enhance the concentration of rare-earth ions such as Er$^{3+}$ which is a light emission lasing source. Therefore, it is difficult to obtain a compact device having a short optical length. It is known that even if the rare-earth concentration is higher, the light emission efficiency deteriorates because of a phenomenon known as cross relaxation. Furthermore, these glass materials are generally multi-component materials and so it is technically difficult to fabricate a light-emitting substance of uniform composition.

The above-described glass materials are fluorides or oxides. It has been pointed out that chlorides produce higher up-conversion emission efficiencies than these glass materials (Tabe et al., Ceramics, 26 (1991), 144). But today, any transparent light-emitting substance which consists of chlorides, has a sufficient up conversion efficiency, and can be used as up conversion laser devices, is not available.

SUMMARY OF THE INVENTION

It is an object of the present invention to provide a transparent, infrared light-excited light-emitting substance which solves the foregoing problems and can be used as a light conversion device for a laser light source.

Generally, a polycrystalline solid material is not transparent because light is scattered at crystal grain boundaries. Hence, the material cannot be used as a device for producing laser oscillation. Single crystals or glasses provide transparent solids. However, it is difficult to obtain rare-earth chloride rich glass, then the concentration of rare-earth elements which operate as light emission sources limited not enough. Consequently, it is difficult to obtain chloride glasses having enough light emission efficiencies.

Accordingly, we have investigated crystalline rare-earth chloride compounds and developed compounds of barium chloride and a rare-earth chloride, which can be used as a light conversion device for converting infrared laser light into visible laser light such as blue or green . This compound shows good transparency, and has excellent up-conversion light emission efficiency. We have the above mentioned problems with the prior art techniques, based on these findings.

According to the present invention, infrared light-excited light-emitting substances given by the following general formula are provided:

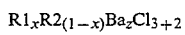

$$R1_x R2_{(1-x)} Ba_z Cl_{3+2}$$

where R1 is rare-earth element group, x satisfies the relation $0.01 < x \leq 1$, R2 is another rare-earth element group, and z satisfies the relation $1 < z < 4$.

In one feature of the invention, in the above general formula, the relation $z = 2$ holds substantially. The transmissivity of the transparent infrared light-excited light emitting substance is higher than 70% in a wavelength range from 400 to 1500 nm excluding wavelengths absorbed by rare-earth ions.

In another feature of the invention, R1 included in the general formula above is one or more rare-earth elements selected from the group consisting of Er, Tm, Ho, Nd, and Pr.

In a further feature of the invention, R2 included in the general formula above is one or more rare-earth elements selected from the group consisting of Yb, Gd, Y, Lu, Ce, and La.

In a yet other feature of the invention, R1 included in the general formula above is one selected from the group consisting of Er, Tm, and Ho, and the relation $x = 1$ holds.

In a still other feature of the invention, R1 included in the general formula above is Er, Tm, or Ho. R2 is Yb or Gd. The sum of the subscription R1 and R2 is 1.

In an additional feature of the invention, R1 included in the general formula above is Er and Tm. R2 is Yb or Gd. The sum of the subscripts for R1 and R2 is 1.

PREFERRED EMBODIMENTS

Figure 1A:
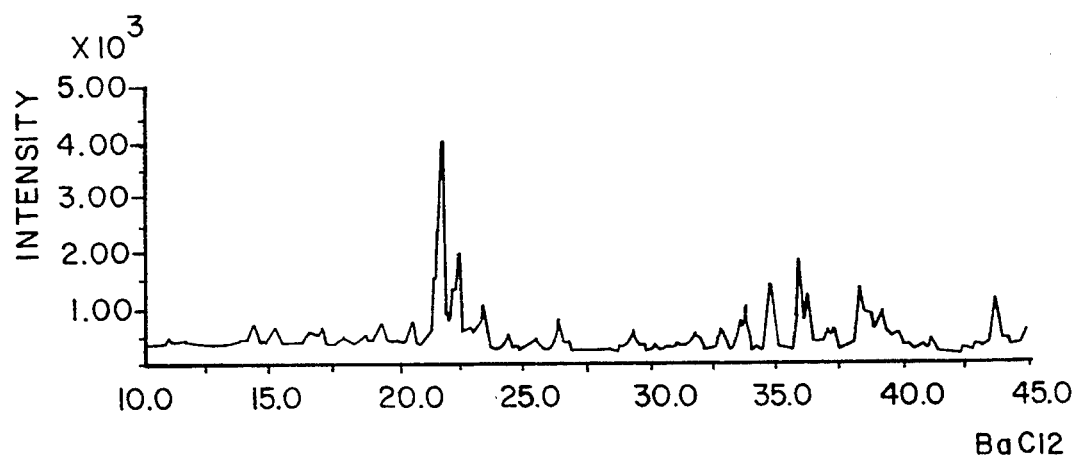
FIG. 1(a), 1(b) and 1(c) is an X-ray diffraction chart of a compound of Example 1.

The present invention lies in transparent, infrared light-excited light-emitting substances consisting of chloride compounds given by the general formula:

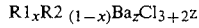

$$R1_x R2_{(1-x)} Ba_z Cl_{3+2z}$$

where R1 is rare-earth element group, x satisfies the relation $0.01 < x \leq 1$, R2 is another rare-earth element group, and z satisfies the relation $1 < z \leq 4$.

The above compounds are obtained by heating and melting powdered raw materials, cooling the melt, and remelting it if necessary. X-ray diffraction analysis has shown that these compounds have characteristic diffraction patterns different from the patterns of $BaCl_2$ and/or $RECl_3$, where RE is a rare-earth element. Therefore, the compounds are not simple mixture of them. Especially, a compound substantially having a relation $z=2$ is a crystalline compound having good transparency.

$ErBa_2Cl_7$ is a typical compound of the novel transparent light-emitting substances. consisted by barium chloride and rare-earth chlorides. The results of a crystal structure determination of this $ErBa_2Cl_7$ have revealed that the present compound is a crystalline compound given by the general formula $REBa_2Cl_7$ (where RE is a rare-earth element) in which 7 chlorine atoms coordinate with 2 Ba atoms and 1 rare-earth element atom. Crystallographically, this compound is a crystal belonging to a monoclinic system of space group $P2_1/a$. Neither crystalline structures nor optical characteristics such as infrared light excitation emission of these compounds consisted by barium chloride and rare-earth chlorides have been known heretofore.

In the general formula described above, the rare-earth element R1 is a light emission source. Typical examples of this rare-earth element include Er, Tm, and Ho. Other examples include Nd, Pr, and Dy. When these rare-earth elements are irradiated with infrared light, the energy levels of the ions make transitions from ground level to excited levels in a stepwise fashion. The transition energy produces emission of light. Typical Er ions and Tm ions have some emission peaks in a wavelength range from 400 to 550 nm, i.e., blue or green light. It is to be noted that R1 is not limited to one species. It may also contain two or more species. In the compounds containing two or more rare-earth elements as R1, each rare-earth elements can be light emission sources depending on the excitation wavelengths and generate the emission spectrum depending on each conditions (concentration of each R1 elements, wavelength of excitation laser etc).

The ratio of the R1 which are light emission sources is so set that the relation $0.01 < x \leq 1$ holds. If $x \leq 0.01$, the content of the light source such as Er or Tm is small, in which case it is impossible to obtain enough emission intensity. Rare-earth elements R2 which assist light emission are not always neccesarry because the compounds including only R1 elements (without R2 elements) can emit. Compounds consisting only of R1 (i.e., $x=1$ in the above general formula) and not containing the emission-assisting substance R2 are embraced in the scope of the invention.

Rare-earth elements R2 other than R1 are emission-assisting substances. Typical examples include Y, Gd, Yb, Lu, La, and Eu. A material containing any one of these rare-earth elements alone does not emit if it is irradiated with infrared light. Therefore, a rare-earth element is used together with the R1. The light emission-assisting substance R2 acts mainly to enhance the emission intensity. Furthermore, the emission-assisting substance R2 serves to lower the threshold value of laser oscillation, thus facilitating laser oscillation. Otherwise, the assisting substance R2 adjusts the concentration of the light-emitting element with keeping the crystal structure. In this way, the emission environment is tuned.

More specifically, we consider that for combinations Er-Yb and Tm-Yb, excited levels of Yb having a larger absorption coefficient and a long excitation life stabilize the excited levels of Er or Tm. It is considered that emission lase by cross relaxation in a combination Tm—Gd decreased as compared with the case in which Tm is contained alone.

In the above-mentioned general formula, the sum of the rare-earth element R1 acting as a light source and the rare-earth element R2 that is a light emission-assisting substance is substantially 1. If the ratios of the rare-earth elements do not satisfy this requirement, it is difficult to form a single crystal and thus a transparent crystal cannot be derived. Since the crystal contains a slight amount of solid solutions and lattice defects, such slight ratio variations are allowed. The sum of the rare earth elements should be substantially 1.

The novel light-emitting substance consists of barium chloride and rare-earth chlorides. Substances consisted by rare-earth chlorides and chlorides of Ca, Sr, and Mg which belong to the same group as Ba and hence are similar in chemical properties with Ba have quite low light emission efficiencies. Some of these substances do not emit at all and thus cannot be used as light-emitting substances. Therefore, if these elements Ca, Sr, and MW belonging to the same group as Ba are intentionally replaced for Ba, then no advantages are obtained. Rare-earth element materials and barium chloride material may inevitably contain impurities. If they are within the purities of the commercially available raw materials, then the inclusion is permitted.

In the above-described general formula, the ratio of Ba is so set that the relation $1 < z \leq 4$ is satisfied. Especially, transparent crystalline solid with above-described structure can be obtained if the ratio value of Ba:z is substantially equal to 2, so the substances became suitable for laser crystal. The good up-conversion emission feature is maintained if the ratio of Ba satisfies the relationship $1 < z \leq 4$, although the transparency dropped because other crystalline phases coexist except in the case of the ratio z=2. Therefore, this can be used in applications where transparency is not required such as an infrared radiation sensor. If the ratio of Ba does not satisfy the relation $1 < z \leq 4$, then the light emission efficiency of the up-conversion deteriorates with undesirable results.

Above mentioned chloride compound crystals provided by this invention emit blue or green light, i.e., 450 to 550 nm in wavelength range, when infrared light irradiated. In the cases of the crystals of R1 =Er, Tm and Ho are stated below;

ErBa2Cl7 emits most intensely approximately 550 nm when the infrared laser approximately 810 nm is irradiated. If the Er partially substituted by Yb, i.e., (Er,Yb)Ba2Cl7, emits intense green light i.e., approximately 550 nm in wavelength, when the infrared laser approximately 980 or 1500 nm is irradiated. These compounds emit approximately 410, 490, 440 and 660 nm at the same time.

TmBa2Cl7 emits green light of wavelengths approximately 455 nm and 550 nm when excited with infrared light having a wavelength approximately 790 nm. TmBa2Cl7 to which Yb is added produces green light having wavelengths approximately 530 nm, 550 nm, and 490 nm when excited with infrared light having wavelengths of 810 nm and 980 rim.

Similarly, HoBa2Cl7 emits green light having main wavelengths approximately 490 nm and 550 nm when excited with light having a wavelength approximately 650 nm.

Compounds containing R1 other than the Er, Tm, and Ho described above are now described. For example, approximately 400 nm emission is expected if Nd is used for R1, and irradiated approximately 600 nm. If Nd alone (R1=Nd, x=1) is combined with barium chloride, it is difficult to obtain a transparent crystal. However, where Nd is used together with Gd or Yb (R1=Nd, R2=Gd or Yb), a transparent crystal having emission peaks at the above-described wavelengths can be obtained provided that x=0.001 to 0.5. If Pr is used as R1, blue, green, and red emission are expected when excited with two wavelengths irradiation of 1010 nm and 835 nm. But if Pr alone (R1=Pr, x=1) is combined with barium chloride, it is difficult to form a transparent crystal. Therefore, it is expected that a transparent crystal emitting visible lights of the above-described is obtained by using Pr together with Gd or Yb (R2=Gd or Yb).

Tm has emission peaks at 480 nm and 450 nm. It is expected that emission at 480 nm is suppressed by combining Eu and Tm and that laser oscillation at 450 nm is facilitated. Sm and Tb produce similar effects as Eu. When the energy levels of Tb are considered, it is expected to emit at approximately 380 nm and 500 nm. Hence, there is a possibility that Tb acts as a light-emitting substance but Tb lacks intermediate excited levels. Therefore, if the intermediate levels are created by combining Tb with Er, Yb, or Ho, then emission of light can be expected.

As described thus far, a crystal according to the present invention has excellent wavelength conversion characteristics owing to an up-conversion phenomenon. It can convert infrared light into visible light. In addition, it can convert visible light having relatively long wavelengths such as red light into light of shorter wavelengths such as violet light and ultraviolet light. Therefore, the infrared light-excited light-emitting substance referred to herein embraces these crystals.

Some examples of the invention are given below. It is to be understood that these examples are merely exemplary and are not intended to restrict the scope of the invention.

EXAMPLE 1

First, 28 g of $Er_2O_3$ (purity of 99.9%) and 60 g of $BaC_{12}$ (purity of 99.9%) were put into a crucible of glassy carbon together with 3 g of fine powder of graphite. These materials were heated to 200° C in a reaction quartz tube under vacuum ($10^{-3}$ torr). Then, the materials were heated to 1000° C. under Ar atomosphere Thus, a melt consisting mainly of $BaCl_2$ was formed. Chlorine gas was blown into the melt at a flow rate of 300 ml/min for 90 minutes to completely chlorinate the $Er_2O_3$. The chlorinated sample was settled at 750° C. for 1 hour to separate unreacted graphite powder. Thereafter, the sample was slowly cooled at a rate of 5° C./hour from 650° C. to 520° C. Then, the sample was cooled completely down to room temperature.

Figure 1B:
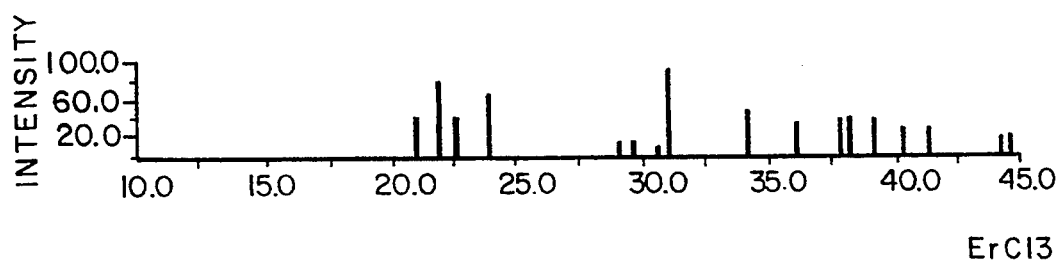
Figure 1C:

The obtained compound contained whisker-like transparent crystals about 2 mm square and about 20 mm long and polyhedral transparent crystals about 4 mm in size. Some of these transparent crystals were chemically analyzed. The molar ratios of Er and Ba were kept at 1:2 within the accuracy of analysis. The crystals were milled and investigated by powder X-ray diffraction. As shown in FIG. 1, neither $ErCl_3$ nor $BaCl_2$ crystalline phases are exists. This demonstrates that these crystals are not mixtures of these materials but consist only of one compound having a composition given by $ErBa_2Cl_7$. In FIG. 1, (a) is an X-ray diffraction chart of a compound of the present example, (b) indicates the peak positions of $BaCl_2$, and (c) indicates the peak position of $ErCl_3$.

Figure 3:
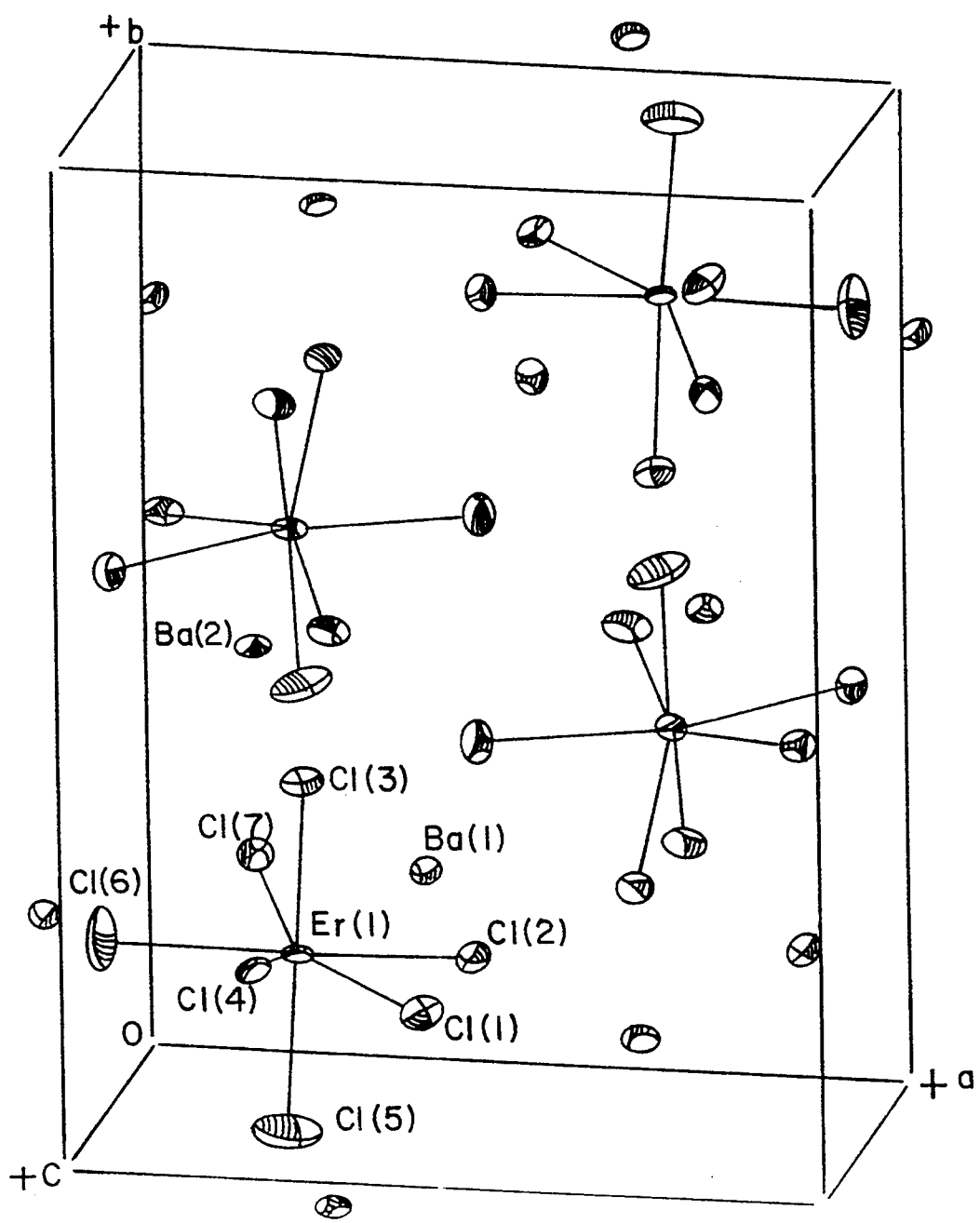
FIG. 3 is a three-dimensional pictorial diagram illustrating the crystal structure of the compound of Example 1.

The structure of this crystal was determined, using a four-axis goniometer AFC5R manufactured by Rigaku Denki K. K., Japan. A small piece of about 0.4 mm was taken from the crystal and sealed in a capillary of quartz glass. The results of the structural analysis show that the compound is a crystal belonging to a monoclinic system of space group P21/a having lattice constants a=10.500 Å, b=15.507 Å, c=6.804 Å, and axial angle $\beta$=90.48°. Determined crystal data is listed in Table 1. The projection of this crystal based on the results of the structural determination is shown in FIG. 3.

TABLE 1

| composition formula | $ErBa_2Cl_7$ | | |
|---|---|---|---|
| crystal system | monoclinic | | |
| lattice constant (Å) | a = 10.500, b = 15.507 | | |
| | c = 6.804, $\beta$ = 90.48 deg | | |
| space group | $P2_1/a$ (#14) | | |
| atomic coordinates | x | y | z |
| Er(1) | 0.21799 | 0.12690 | 0.21711 |
| Ba(1) | 0.45076 | 0.27990 | 0.73642 |
| Ba(2) | 0.17645 | 0.43899 | 0.26432 |
| Cl(1) | 0.4147 | 0.10475 | 0.4879 |
| Cl(2) | 0.4291 | 0.10430 | −0.0004 |
| Cl(3) | 0.2051 | 0.27236 | 0.0009 |
| Cl(4) | 0.1233 | 0.07055 | −0.1300 |
| Cl(5) | 0.2134 | −0.0407 | 0.2928 |
| Cl(6) | −0.0289 | 0.1399 | 0.2894 |
| Cl(7) | 0.1978 | 0.25749 | 0.4892 |

The transmissivity of the crystal having a thickness of 2 mm was measured in a wavelength range from 400 to 1500 nm. A transmissivity exceeding 80% was obtained except at the wavelengths absorbed by Er ions. When this crystal was in air, the crystal absorbed moisture and easily deteriorated. To prevent deterioration of the sample and reflection and scattering at the surface, the sample surface was covered with transparent film, and the transmissivity was measured. More specifically, the sample was buried in opaque wax. The surface was polished to expose the sample. Liquid paraffin was applied as a thin film to the exposed surface, and the sample was coated with transparent film. Blank measurements with small slit fitted to sample sizes were carried out prior to sample measurements. The transmissivity is indicated by the relative values (transmittances of sample/blank %). In this measuring method, the transparent film that covers the sample surface inevitably absorbs light. Also, reflection and scattering take place at the interface. Consequently, it is inevitable that the transmissivity decreases by about 15 to 20% compared with the transmissivity of the bare sample. The transmissivity of 80% in the present measuring method is comparable to those of conventional, commercially available transparent glasses (slide glasses).

Figure 4A:
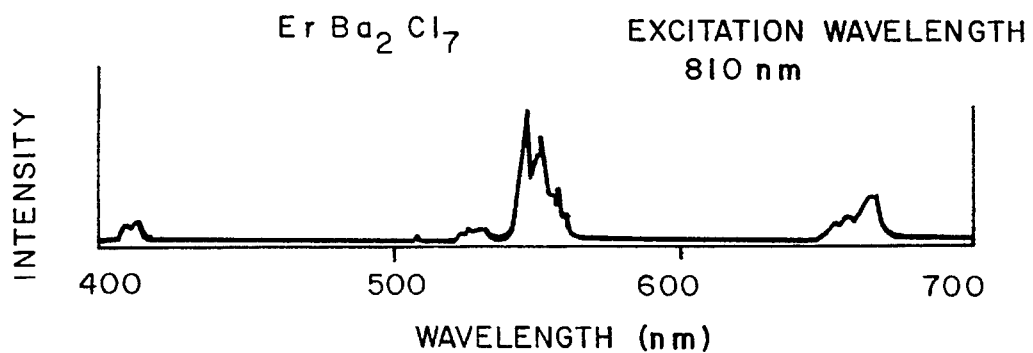
FIGS. 4(a) and 4(b) are an emission spectrum of the compound of Example 1.
Figure 4B:
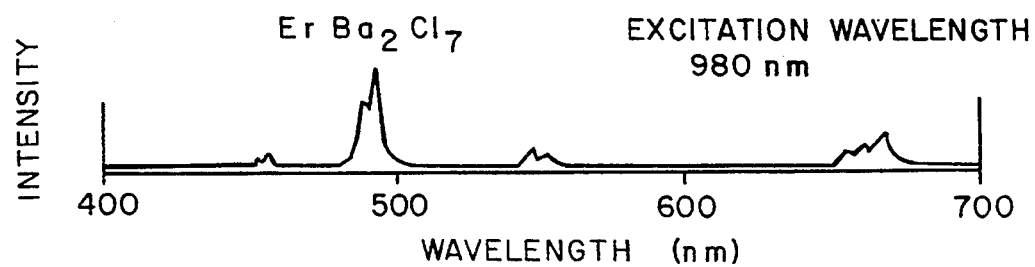

This transparent crystal was irradiated with diode laser light having a nominal wavelength of 810 nm. The actually measured wavelength was 807 nm. The output power was 4 mW. Green emission was observed inside the crystal along an irradiated beam. An emission spectrum is shown in FIG. 4. This transparent crystal was irradiated with pulse laser light having a wavelength of 980 nm and a power of about 1 mJ. We observed emission of blue and white light. This emission spectrum is also shown in FIG. 4.

EXAMPLE 2

Figure 2A:
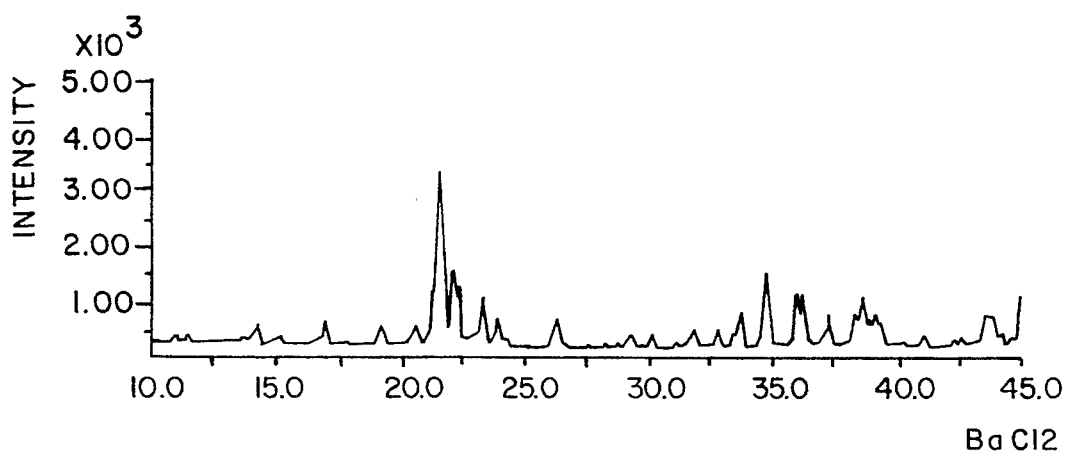
FIG. 2(a), 2(b) and 2(c) is an X-ray diffraction chart of a compound of Example 2.
Figure 2B:
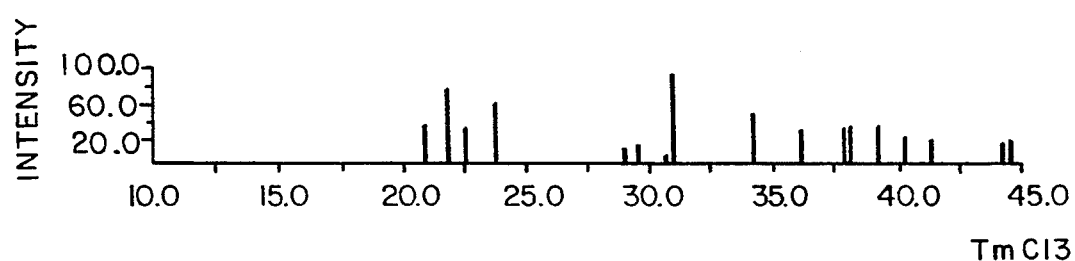
Figure 2C:
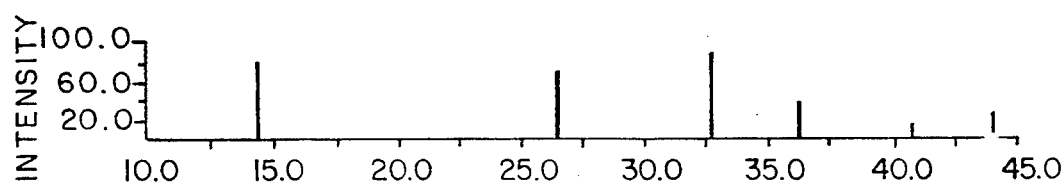

A transparent crystal was created similarly to Example 1 except that the 28 g of $Tm_2O_3$ (purity of 99.9%) was replaced by $Er_2O_3$. Chemical analysis of this crystal has shown that the molar ratios of Tm and Ba were kept at 1:2 within the accuracy of analysis. This crystal was milled and investigated by powder X-ray diffraction techniques. As shown in FIG. 2, neither $TmCl_3$ nor $BaCl_2$ crystalline phases are existed. This demonstrates that this crystal is not a mixture of these two materials but consists only of one compound having a composition given by $TmBa_2Cl_7$. In FIG. 2, (a) is an X-ray diffraction chart of a compound of the present example, (b) indicates the peak positions of $BaCl_2$, and (c) indicates the peak position of $ErCl_3$.

Figure 5:
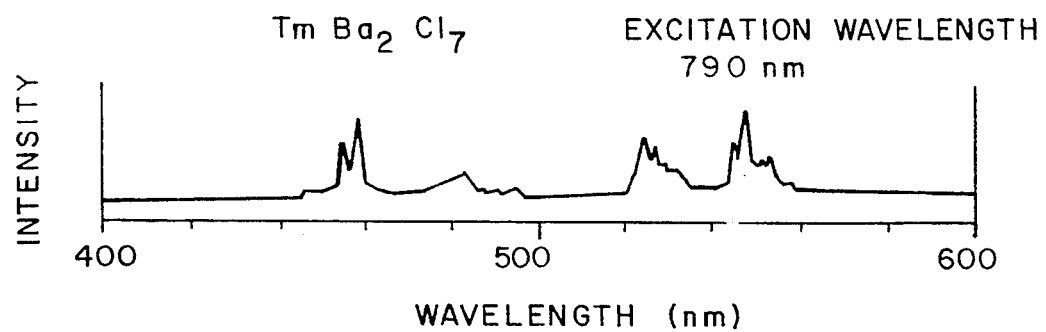
FIG. 5 is an emission spectrum of a compound of Example 2.

The transmissivity of the crystal having a thickness of 2 mm was measured in a wavelength range from 400 to 1500 nm. A transmissivity exceeding 80% was obtained except at the wavelengths absorbed by Tm ions. This transparent crystal was irradiated with diode laser light having a nominal wavelength of 785 nm. The actually measured wavelength was 790 nm. The output power was 18 mW. It was observed that blue-green light was emitted inside the crystal. An emission spectrum of this is shown in FIG. 5.

EXAMPLE 3

Figure 6:
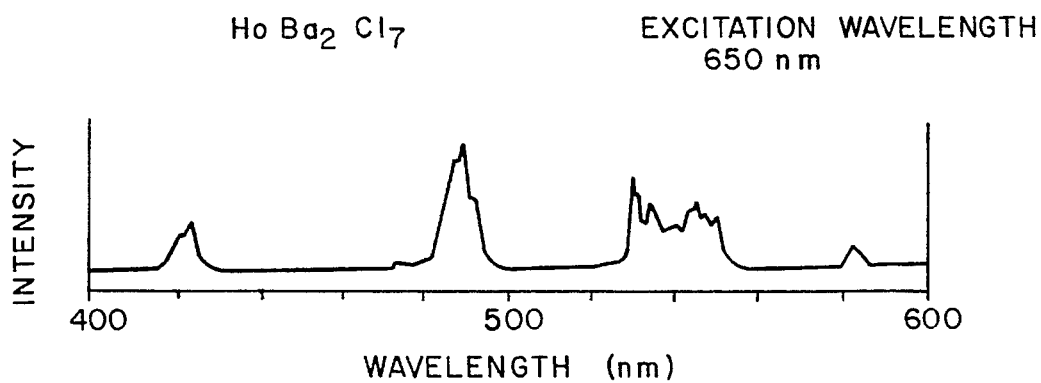
FIG. 6 is an emission spectrum of a compound of Example 3.
Figure 7A:
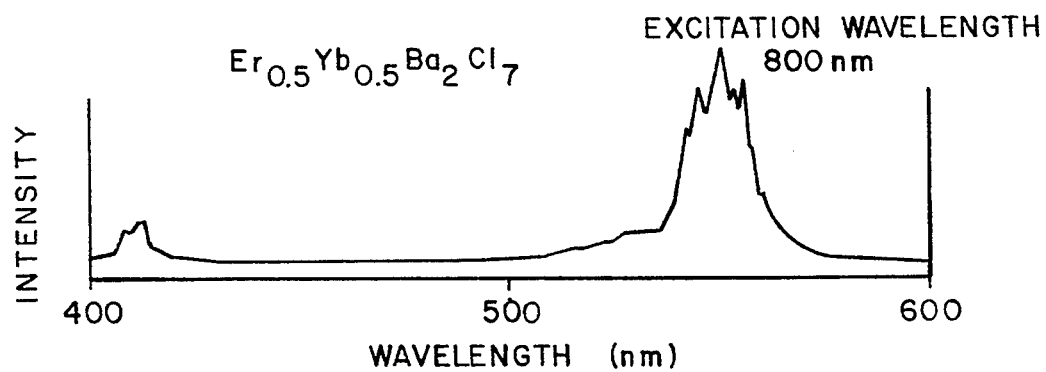
FIGS. 7(a) and 7(b) are an emission spectrum of a compound of Example 4.
Figure 7B:
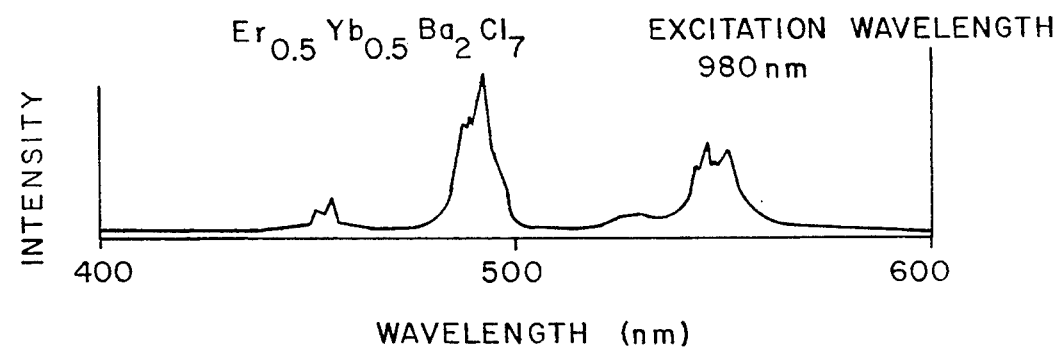
Figure 8A:
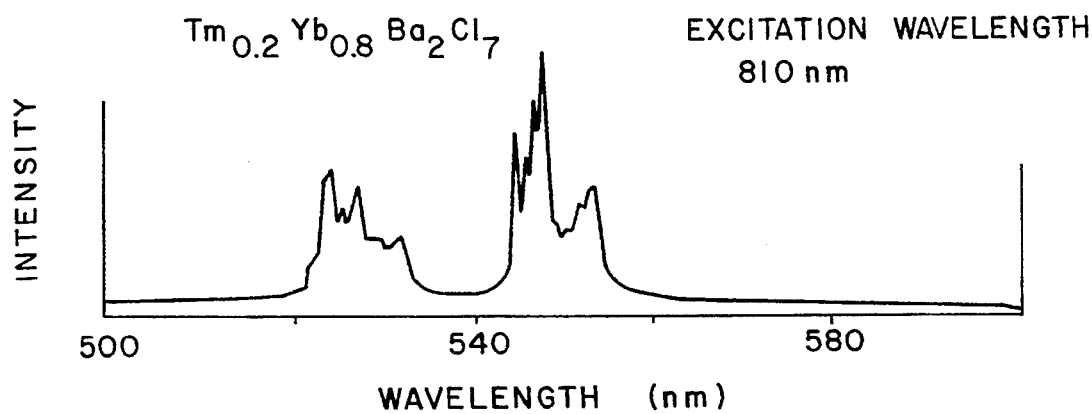
FIGS. 8(a) and 8(b) are an emission spectrum of a compound of Example 5.
Figure 8B:
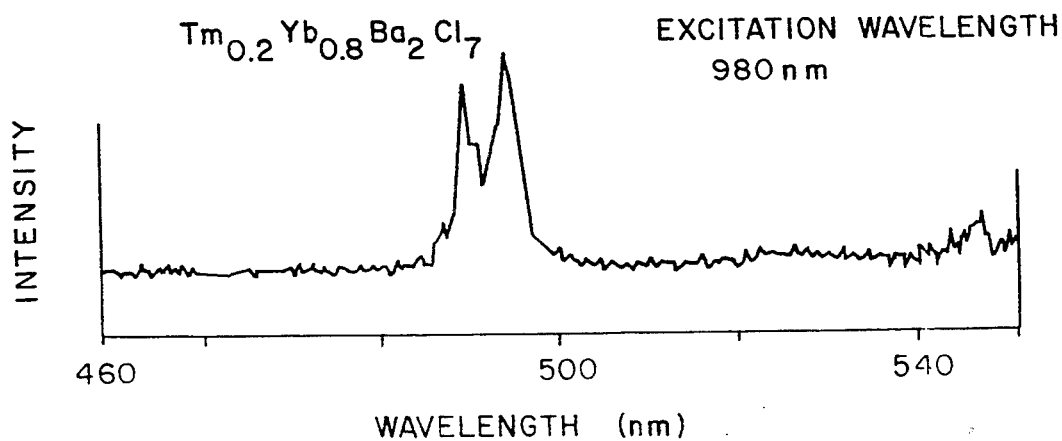
Figure 9A:
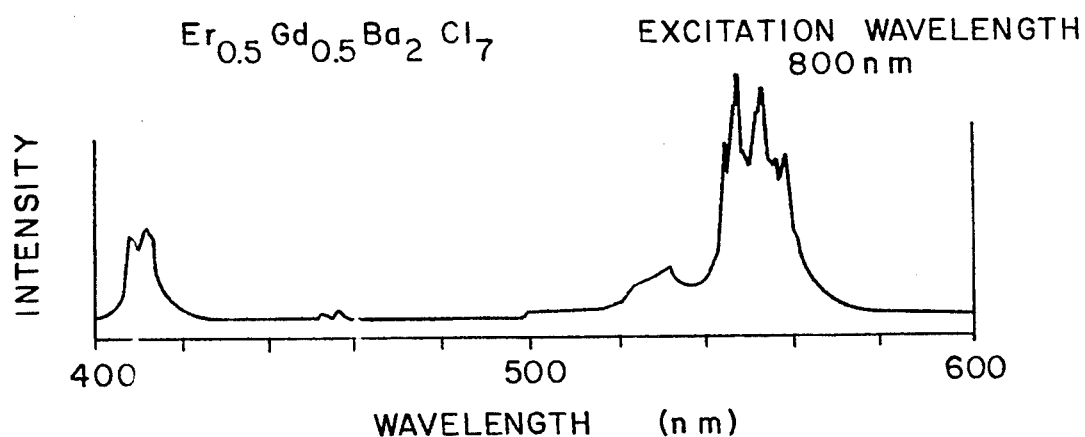
FIGS. 9(a) and 9(b) are an emission spectrum of a compound of Example 6.
Figure 9B:
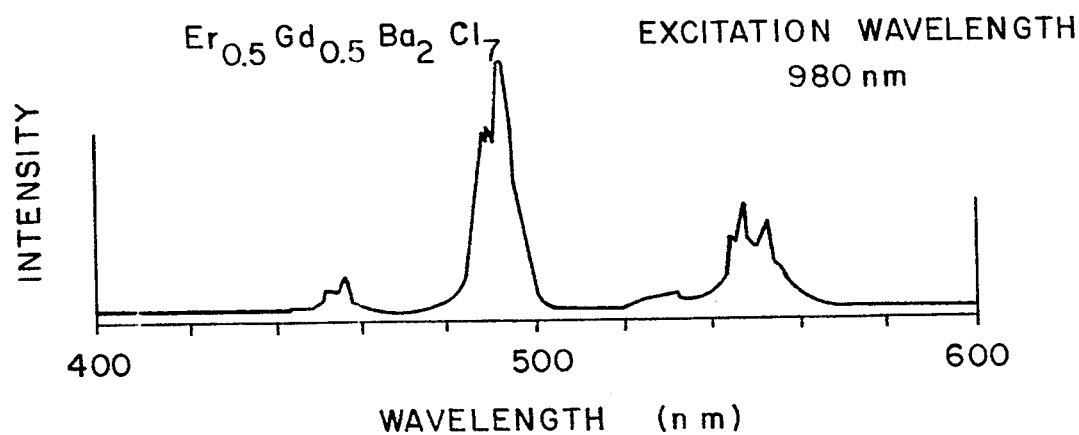
Figure 10A:
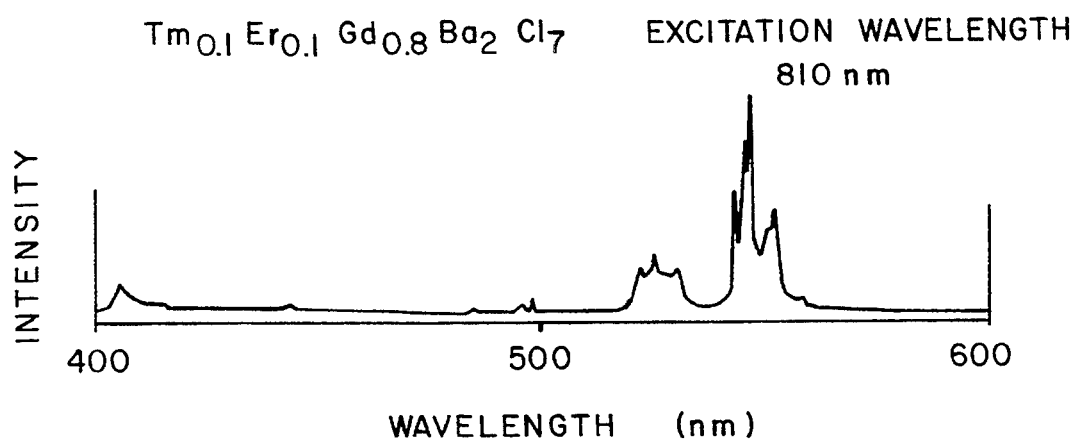
FIGS. 10(a) and 10(b) are an emission spectrum of a compound of Example 7.
Figure 10B:
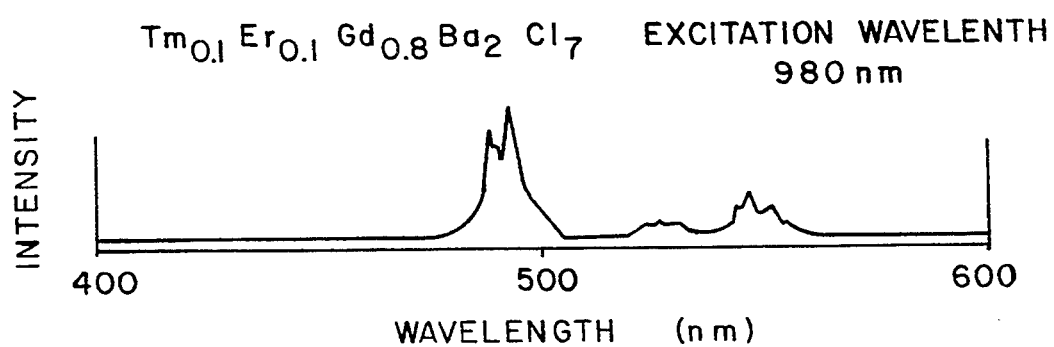

Transparent crystals having compositions listed in Table 2 were prepared in the same way as in Example 1. Emission characteristics of these crystals excited by each wavelength listed in Table 2 were observed. The results are shown in Table 2 together with the results of Examples 1 and 2. Emission spectra of the samples are shown in FIG. 6 (Example 3), FIG. 7 (Example 4), FIG. 8 (Example 5), FIG. 9 (Example 6), and FIG. 10 (Example 7).

As shown in Table 2, every sample of the present example emits intense green or blue light when excited with infrared light.

A light-emitting substance according to the invention can convert infrared light into visible light in a range from blue light to green light at a high efficiency. Intense light can be obtained from the novel light-emitting substance. Compounds in which the factor of Ba is approximately 2 show high transparency and hence can be used as a laser oscillator device. This enables fabrication of a highly practical, compact semiconductor visible light laser using infrared diode laser as an excitation source. Furthermore, it is expected that the novel light-emitting substance is used in a light conversion filter for a photodiode and in an infrared diode as a light conversion device producing visible light. Additionally, the novel light-emitting substance can be employed to detect infrared radiation. Further, the novel light-emitting substance can be applied to optical amplifiers.

TABLE 2

| Ex. | composition | transmissivity (%) | excitation wavelength | main emission wavelength | emission intensity |
|---|---|---|---|---|---|
| 1 | $ErBa_2Cl_7$ | over 80 | 810 nm | near 545 nm, 550 nm (green) | strong |
|  |  |  | 980 nm | near 450 nm, 495 nm (blue-green) | strong |
| 2 | $TmBa_2Cl_7$ | over 80 | 790 nm | near 455 nm, 550 nm (green) | somewhat weak |
| 3 | $HoBa_2Cl_7$ | over 80 | 650 nm | near 420 nm, 490 nm (blue-green) | strong |
| 4 | $Er_{0.5}Yb_{0.5}Ba_2Cl_7$ | over 75 | 800 nm | near 415 nm, 550 nm (yellow-green) | much stronger near 550 nm than in |
|  |  |  | 980 nm | near 490 nm, 550 nm (green) | Ex. 1 |
| 5 | $Tm_{0.2}Yb_{0.8}Ba_2Cl_7$ | over 75 | 810 nm | near 530 nm, 555 nm (green) | green is much stronger than in |
|  |  |  | 980 nm | near 490 nm (blue-green) | Ex. 3 |
| 6 | $Er_{0.5}Gd_{0.5}Ba_2Cl_7$ | over 75 | 800 nm | near 410 nm, 550 nm (green) | blue is stronger than in Ex. 1 |
|  |  |  | 980 nm | near 495 nm, 550 nm (green) |  |
| 7 | $Tm_{0.1}Er_{0.1}Gd_{0.8}Ba_2Cl_7$ | over 70 | 810 nm | near 530 nm, 550 nm (green) | strong green |
|  |  |  | 980 nm | near 490 nm, 550 nm | strong blue |

TABLE 2-continued

| Ex. | composition | trans-missivity (%) | excitation wavelength | main emission wavelength (blue) | emission intensity |
|-----|-------------|---------------------|-----------------------|-------------------------------|--------------------|

EXAMPLE 4

Compounds (1)~(6) having compositions listed in the following Table 3 were obtained in the way that anhydrous erbium chloride ($ErCl_3$) was mixed with anhydrous barium chloride ($BaCl_2$) and the mixture was sealed in a quartz ampoule in a glove box filled with argon gas. Then the mixture was heated in an electric furnace and after being melted, cooled into room temperature.

For all samples, emission of intensive green light from these compounds was observed by irradiation with a diode laser having a nominal wave length of 810 nm (power about 35 mW). Emission intensity of Samples (2)~(5) were generally of the same level, but the intensity of Samples (1) and (6) were slightly lower than the other samples.

TABLE 3

|     | $ErCl_3$ | $BaCl_2$ | $z:ErBa_2Cl_{3+2z}$ |
|-----|----------|----------|---------------------|
| (1) | 7.0 g    | 3.0 g    | 0.56                |
| (2) | 5.0 g    | 5.0 g    | 1.3                 |
| (3) | 4.0 g    | 6.0 g    | 2.0                 |
| (4) | 3.0 g    | 7.0 g    | 3.0                 |
| (5) | 2.5 g    | 7.5 g    | 3.9                 |
| (6) | 2.0 g    | 8.0 g    | 5.3                 |

What is claimed is:

1. An infrared light-excited light-emitting substance expressed by a general formula given by $$R1_xR2_{(1-x)}Ba_zCl_{3+2z}$$

where R1 is at least one light-emitting rare-earth element x, satisfies a relation $0.01 < x \leq 1$, R2 is at least one emission-assisting rare-earth element, and z satisfies a relation $1 < z < 4$.

2. The infrared light-excited light-emitting substance of claim 1, wherein said z of said general formula is equal to 2, and wherein said light-emitting substance has a transmissivity exceeding 70% in a wavelength range from 400 to 1500 nm, excluding wavelengths absorbed by rare-earth ions.

3. The infrared light-excited light-emitting substance of claim 2, wherein said R1 includes at least one rare-earth element selected from the group consisting of Er, Tm, Ho, Nd, and Pr.

4. The infrared light-excited light-emitting substance of claim 2, wherein said R2 includes of least one rare-earth element selected from the group consisting of Yb, Gd, Y, Lu, Ce, and La.

5. The infrared light-excited light-emitting substance of claim 2, wherein said R1 includes at least one element selected from the group consisting of Er, Tm, and Ho, and wherein $x=1$.

6. The infrared light-excited light-emitting substances of claim 2, wherein
said R1 includes at least one element selected from the group consisting of Er, Tm and Ho; and
said R2 includes at least one element selected from the group consisting of Yb and Gd.

7. The infrared light-excited light-emitting substance of claim 2, wherein
said R1 is a compound including Er and Tm; and
said R2 includes at least one element selected from the group consisting of Yb and Gd.

8. A substance as claimed in claim 1, wherein z is equal to two.

9. A substance as claimed in claim 1, wherein R1 includes at least one element selected from the group consisting of Er, Tm, Ho, Nd and Pr.

10. A substance as claimed in claim 1, wherein R2 includes at least one element selected from the group consisting of Yb, Gd, Y, Lu, Ce and La.

11. A substance as claimed in claim 9, wherein $x=1$.

12. A substance as claimed in claim 8, wherein R1 includes Er and Tm and R2 includes at least one element selected from the group consisting of Yb and Gd.

13. An infrared light-excited, light-emitting substance having a chemical formula of $$R1Ba_2Cl_7$$

wherein R1 is a rare earth element group including at least one rare earth element selected from the group consisting of Er, Tm, Ho, Nd and Pr.

* * * * *

UNITED STATES PATENT AND TRADEMARK OFFICE
CERTIFICATE OF CORRECTION

PATENT NO. : 5,439,616
DATED : August 8, 1995
INVENTOR(S) : Shoji Ishiwata; Etsuji Kimura; Michihiro Tanaka; Yasuhiro Hanaue; Yuhu Wang; Shinobu Nagahama and Naruhito Sawanobori It is certified that error appears in the above-indentified patent and that said Letters Patent is hereby corrected as shown below:

Column 1 Line 39 after "production of a" insert --practical--.

Column 2 Lines 4-5 "up converson" should read --up-conversion--.

Column 2 Line 28 "green ." should read --green.--.

Column 2 Line 30 "have the" should read --have solved the--.

Column 2 Line 36 "$R1_xR2_{(1-x)}Ba_zCl_{3+2}$" should read --$R1_xR2_{(1-x)}Ba_zCl_{3+2z}$--.

Column 2 Line 61 "subscription" should read --subscripts for--.

Column 3 Line 21 "PREFERRED EMBODIMENTS" should read --DESCRIPTION OF THE PREFERRED EMBODIMENTS--.

Column 3 Line 30 "$\leq 4.$" should read --$< 4.$--.

Column 3 Line 36 after "not" insert --a--.

Column 3 Line 41 after "substances" delete ".".

UNITED STATES PATENT AND TRADEMARK OFFICE
CERTIFICATE OF CORRECTION

PATENT NO. : 5,439,616
DATED : August 8, 1995
INVENTOR(S) : Shoji Ishiwata; Etsuji Kimura; Michihiro Tanaka; Yasuhiro Hanaue; Yuhu Wang; Shinobu Nagahama and Naruhito Sawanobori It is certified that error appears in the above-indentified patent and that said Letters Patent is hereby corrected as shown below:

Column 3 Line 67 "R1 ," should read --R1,--.

Column 3 Line 67 "elements" should read --element--.

Column 4 Lines 1-2 "conditions" should read --condition--.

Column 4 Line 2 "elements," should read --element,--.

Column 4 Line 3 "etc)." should read --etc.).--.

Column 4 Line 5 "$\leq$ 0.01," should read --< 0.01,--.

Column 4 Line 55 "MW" should read --Mg--.

Column 4 Line 62 "$\leq$ 4" should read --< 4--.

Column 4 Line 68 "$\leq$ 4," should read --< 4,--.

Column 5 Line 5 "$\leq$ 4," should read --< 4,--.

Column 5 Line 12 "below;" should read --below.--.

Column 5 Line 13 "ErBa2Cl7" should read --ErBa$_2$Cl$_7$--.

Column 5 Line 16 "(Er,Yb)Ba2Cl7," should read --(Er,Yb)Ba$_2$Cl$_7$,--.

Column 5 Line 27 "rim." should read --nm.--.

Column 5 Line 35 "R1 ," should read --R1,--.

UNITED STATES PATENT AND TRADEMARK OFFICE
CERTIFICATE OF CORRECTION

PATENT NO. : 5,439,616
DATED : August 8, 1995
INVENTOR(S) : Shoji Ishiwata; Etsuji Kimura; Michihiro Tanaka; Yasuhiro Hanaue; Yuhu Wang; Shinobu Nagahama and Naruhito Sawanobori It is certified that error appears in the above-indentified patent and that said Letters Patent is hereby corrected as shown below:

Column 5 Line 35 "R1  ," should read --R1,--.

Column 5 Line 37 "chloride  ," should read --chloride,--.

Column 5 Line 46 "chloride  ," should read --chloride,--.

Column 6 Line 10 "$BaC_{12}$" should read --$BaCl_2$--.

Column 6 Lines 14-15 after "atmosphere" insert --.--.

Column 6 Line 31 "are exists." should read --exist.--.

Column 7 Line 42 "are existed." should read --exist.--.

Column 9 Line 11 "(1)~(6)" should read --(1)-(6)--.

Column 9 Line 22 "wave length" should read --wavelength--.

Column 9 Line 24 "(2)~(5)" should read --(2)-(5)--.

Claim 1 Line 41 Column 9 "where" should read --wherein--.

Claim 1 Line 42 Column 9 "element x," should read --element, x--.

UNITED STATES PATENT AND TRADEMARK OFFICE
CERTIFICATE OF CORRECTION

PATENT NO. : 5,439,616
DATED : August 8, 1995
INVENTOR(S) : Shoji Ishiwata; Etsuji Kimura; Michihiro Tanaka; Yasuhiro Hanaue; Yuhu Wang; Shinobu Nagahama and Naruhito Sawanobori It is certified that error appears in the above-indentified patent and that said Letters Patent is hereby corrected as shown below:

Claim 4 Line 13 Column 10 "includes of" should read --includes at--.

Claim 6 Line 20 Column 10 "substances" should read --substance--.

Signed and Sealed this

Sixteenth Day of January, 1996

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,439,616
DATED : August 8, 1995
INVENTOR(S) : Shoji Ishiwata, et al It is certified that error appears in the above-indentified patent and that said Letters Patent is hereby corrected as shown below:

On the title page, item [73], after "Corporation," insert --and Sumita Optical Glass, Inc., both of--.

Signed and Sealed this

Twenty-third Day of April, 1996

Attest:

BRUCE LEHMAN

*Attesting Officer*   *Commissioner of Patents and Trademarks*